(12) United States Patent
Kim (10) Patent No.: US 7,639,553 B2
(45) Date of Patent: Dec. 29, 2009

(54) DATA BUS SENSE AMPLIFIER CIRCUIT

(75) Inventor: Keun Kook Kim, Ichon (KR)

(73) Assignee: Hynix Semiconductor Inc. (KR)

( * ) Notice: Subject to any disclaimer, the term of this patent is extended or adjusted under 35 U.S.C. 154(b) by 161 days.

(21) Appl. No.: 12/018,775

(22) Filed: Jan. 23, 2008

(65) Prior Publication Data

US 2009/0045849 A1  Feb. 19, 2009

(30) Foreign Application Priority Data

Aug. 14, 2007  (KR) .................. 10-2007-0081554

(51) Int. Cl.
*G11C 7/00* (2006.01)
(52) U.S. Cl. .................... 365/194; 365/196
(58) Field of Classification Search .................. 365/194, 365/196, 205, 207, 208; 327/51, 55
See application file for complete search history.

(56) References Cited

U.S. PATENT DOCUMENTS 6,298,004 B1 * 10/2001 Kawasaki et al. ...... 365/233.12
6,816,425 B2  11/2004 Graham et al.
2007/0030754 A1 *  2/2007 Gomm .................. 365/233

FOREIGN PATENT DOCUMENTS

| JP | 2002-197870 | 7/2002 |
| KR | 1020010061379 A | 7/2001 |
| KR | 1020020055080 A | 7/2002 |
| KR | 1020070021371 A | 2/2007 |

\* cited by examiner

*Primary Examiner*—Vu A Le
(74) *Attorney, Agent, or Firm*—Baker & McKenzie LLP (57) ABSTRACT

A data bus sense amplifier circuit can include a first sense amplifier block configured to provide first amplified signals by sensing inputted signals, a second sense amplifier block configured to provide second amplified signals by sensing the first amplified signals, and a sense amplifier control unit configured to provide first and second enable signals which control activations of the first and second sense amplifier blocks, respectively, wherein the sense amplifier control unit controls the first enable signal to be synchronized with the second enable signal so that the first enable signal is inactivated.

24 Claims, 5 Drawing Sheets

DATA BUS SENSE AMPLIFIER CIRCUIT

CROSS-REFERENCES TO RELATED APPLICATION

The present application claims the benefit under 35 U.S.C. 119(a) of Korean application number 10-2007-0081554, filed on Aug. 14, 2007, in the Korean Intellectual Property Office, which is incorporated by reference in its entirety as if set forth in full.

BACKGROUND

1. Technical Field

The disclosure herein relates to a data bus sense amplifier circuit and, more particularly, to a two-stage data bus sense amplifier circuit.

2. Related Art

A conventional semiconductor memory device latches cell data, which corresponds to a word line activated by a row address, through a bit line sense amplifier. Then, when a column address is received, the information of the bit line sense amplifier is amplified again in a data bus sense amplifier. In order to improve the sensing ability of such a data bus sense amplifier, a two-stage sense amplifier is used.

Figure 1:
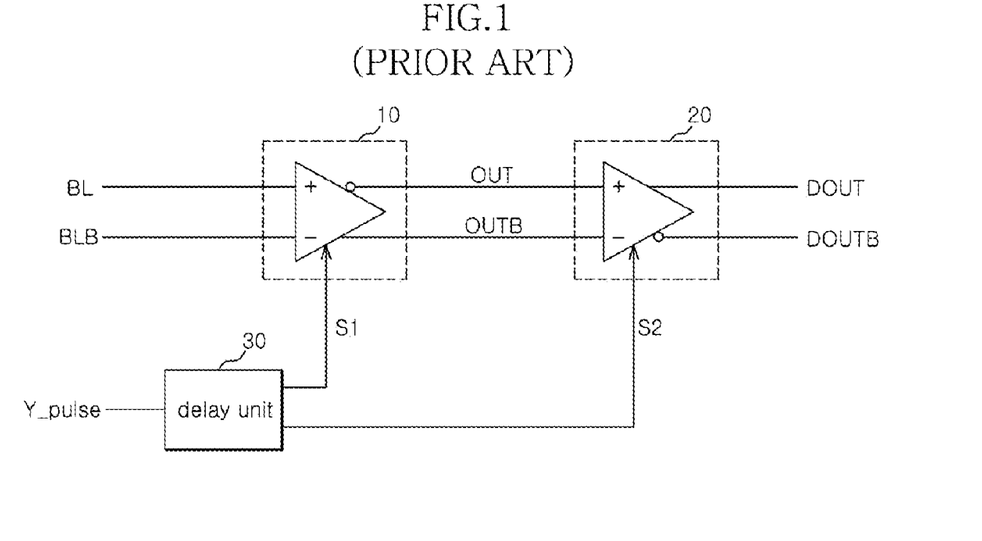
FIG. 1 is a block diagram of an exemplary data bus sense amplifier circuit.

FIG. 1 is a conceptual block diagram of a conventional two-stage data bus sense amplifier circuit. The conventional data bus sense amplifier circuit includes a first sense amplifier block 10, a second sense amplifier block 20 and a delay unit 30.

In the data bus sense amplifier circuit, when a predetermined potential difference exists between the levels of signals sensed in the first sense amplifier block 10, the second sense amplifier block 20 starts sensing operation. That is, inputted bit line signals (BL) and (BLB) are amplified through both the first sense amplifier block 10 and the second sense amplifier block 20 to be provided as output signals (DOUT) and (DOUTB).

More specifically, the bit line signals (BL) and (BLB) are sensed by the first sense amplifier block 10 to be provided as the first amplified signals (OUT) and (OUTB). The first amplified signals (OUT) and (OUTB) are sensed again by the second sense amplifier block 20 to be provided as the output signals (DOUT) and (DOUTB). The output signals (DOUT) and (DOUTB) are provided to a global data line.

Meanwhile, the delay unit 30 provides first and second enable signals (S1) and (S2) to the first sense amplifier block 10 and the second sense amplifier block 20, respectively. Although the first and second enable signals (S1) and (S2) respond to a column control pulse signal (Y_pulse), they can have different activation timings with different delay amounts. Nevertheless, they have the same pulse width as the column control pulse signal (Y_pulse). Thus, a section in which the first enable signal (S1) is activated can overlap with a section in which the second enable signal (S2) is activated. Since the first sense amplifier block 10 can operate even during the sensing operation of the second sense amplifier block 20, the current consumption can be increased.

SUMMARY

According to one aspect, there is provide a data bus sense amplifier circuit that can comprise a first sense amplifier block configured to provide first amplified signals by sensing inputted signals, a second sense amplifier block configured to provide second amplified signals by sensing the first amplified signals, and a sense amplifier control unit configured to provide first and second enable signals which control activations of the first and second sense amplifier blocks, respectively, wherein the sense amplifier control unit can control the first enable signal to be synchronized with the second enable signal so that the first enable signal is inactivated.

According to another aspect, a data bus sense amplifier circuit can comprise a sense amplifier control unit configured to provide a first enable signal and a second enable signal which can be generated in response to a column control pulse signal, wherein the first enable signal of the sense amplifier control unit can be inactivated in response to a feedback level of the second enable signal.

According to still another aspect, a data bus sense amplifier circuit can comprise a first sense amplifier block configured to provide first amplified signals in response to a first enable signal by sensing signals which are inputted from bit lines, a second sense amplifier block configured to provide second amplified signals in response to a second enable signal by sensing the first amplified signals from the first sense amplifier block, and a sense amplifier control unit configured to provide the first enable signal and the second enable signal which control activations of the first and second sense amplifier blocks, respectively, wherein the sense amplifier control unit can include a first delay unit configured to provide the first enable signal in response to a column control pulse signal and an inverted and delayed feedback signal of the second enable signal, a second delay unit configured to provide the second enable signal in response to the column control pulse signal, and a third delay unit configured to invert and delay the second enable signal to provide the second enable signal as the feedback signal. These and other features, aspects, and embodiments are described below in the section entitled "Detailed Description."

BRIEF DESCRIPTION OF THE DRAWINGS

Features, aspects, and embodiments are described in conjunction with the attached drawings, in which.

DETAILED DESCRIPTION

Figure 2:
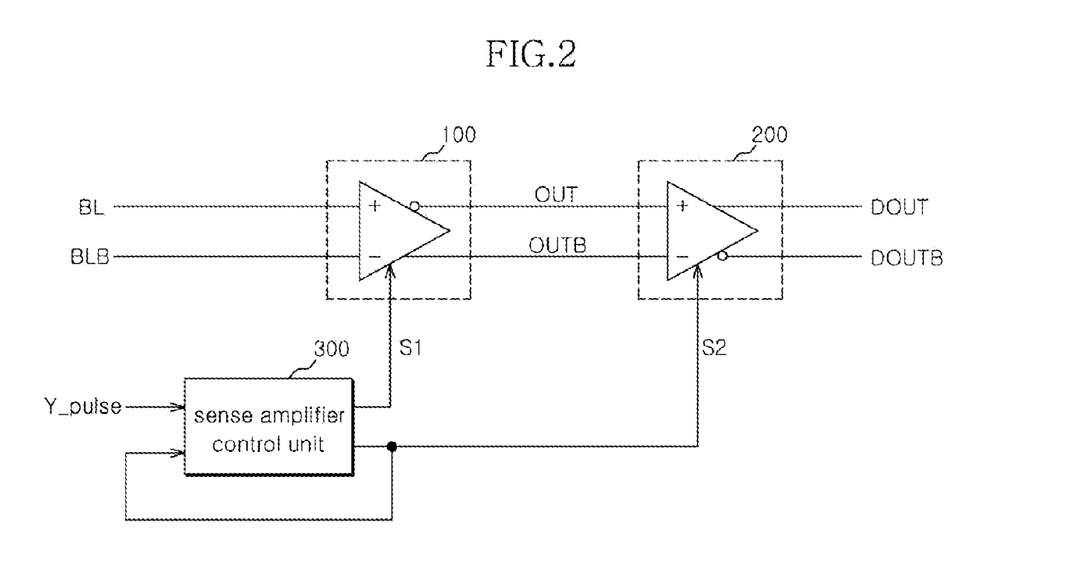
FIG. 2 is a block diagram of a data bus sense amplifier circuit according to one embodiment.

FIG. 2 is a block diagram of a data bus sense amplifier circuit according to one embodiment described herein. Referring to FIG. 2, the data bus sense amplifier circuit is a two-stage amplifier, and can include a one-stage first sense amplifier block 100, a two-stage second sense amplifier block 200, and a sense amplifier control unit 300.

In the data bus sense amplifier circuit, when a predetermined potential difference exists between the levels of signals sensed in the first sense amplifier block 100, the second sense amplifier block 200 can start a sensing operation. Specifically, the first sense amplifier block 100 can receive bit line signals (BL) and (BLB); namely, data from a memory cell and provide first amplified signals (OUT) and (OUTB).

The second sense amplifier block 200 can receive the first amplified signals (OUT) and (OUTB) and provide second amplified signals (DOUT) and (DOUTB). In one embodiment, the bit line signals (BL) and (BLB) can be provided from a bit line sense amplifier (not shown). The bit line signals (BL) and (BLB) can be equalized before the sensing operation, but their levels are inverse to each other after a sensing starts. At the initial operation of the data bus sense amplifier circuit, the first sense amplifier block 100 can sense the bit line signals (BL) and (BLB). Then, the second sense amplifier block 200 can perform a second sensing so that the first amplified signals (OUT) and (OUTB) can have more definite signal levels. The second sense amplifier block 200 can output second amplified signals (DOUT) and (DOUTB) which can be provided to a global data line.

The sense amplifier control unit 300 can provide first and second enable signals (S1) and (S2) which can control the sensing operation of the first sense amplifier block 100 and the sensing operation of the second sense amplifier block 200, respectively. More specifically, the sense amplifier control unit 300 can provide the first and second enable signals (S1) and (S2) which respond to a column control pulse signal (Y_pulse) but can have different activation timings with different delay amounts. Here, the column control pulse signal (Y_pulse) can be a criterion pulse signal for the sensing operation. That is, when a column address is inputted, the column control pulse signal (Y_pulse) can be generated as a signal to control column-based circuits and the information of the bit line sense amplifier can be sensed by the column control pulse signal (Y_pulse) in the data bus sense amplifier circuit.

The sense amplifier control unit 300, according to the one embodiment, can be synchronized with the activated second enable signal S2, thereby controlling the first enable signal (S1) to be inactivated. Therefore, in one embodiment, when the second sense amplifier block 200 starts the second sensing operation, the first sense amplifier block 100 can be controlled not to operate.

Figure 3A:
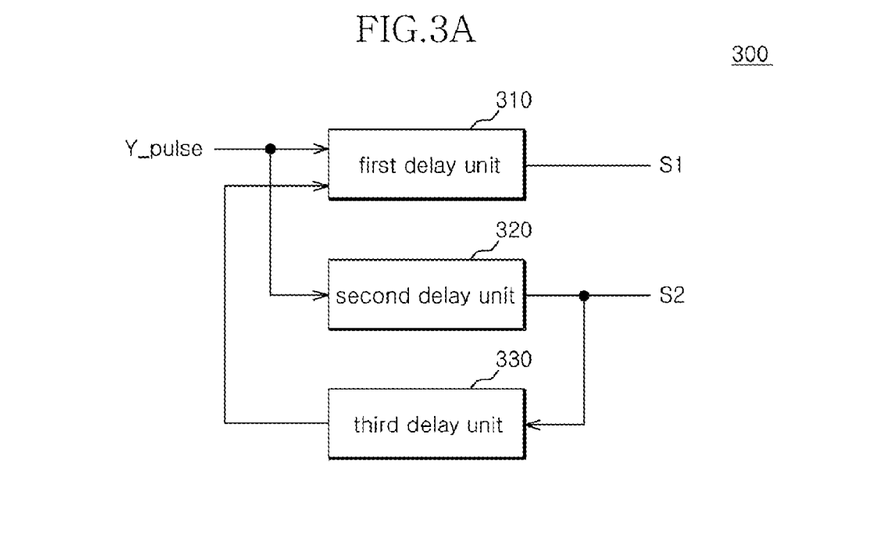
FIGS. 3a and 3b are block and circuit diagrams illustrating a sense amplifier control unit that can be included in the circuit illustrated in FIG. 2.
Figure 3B:
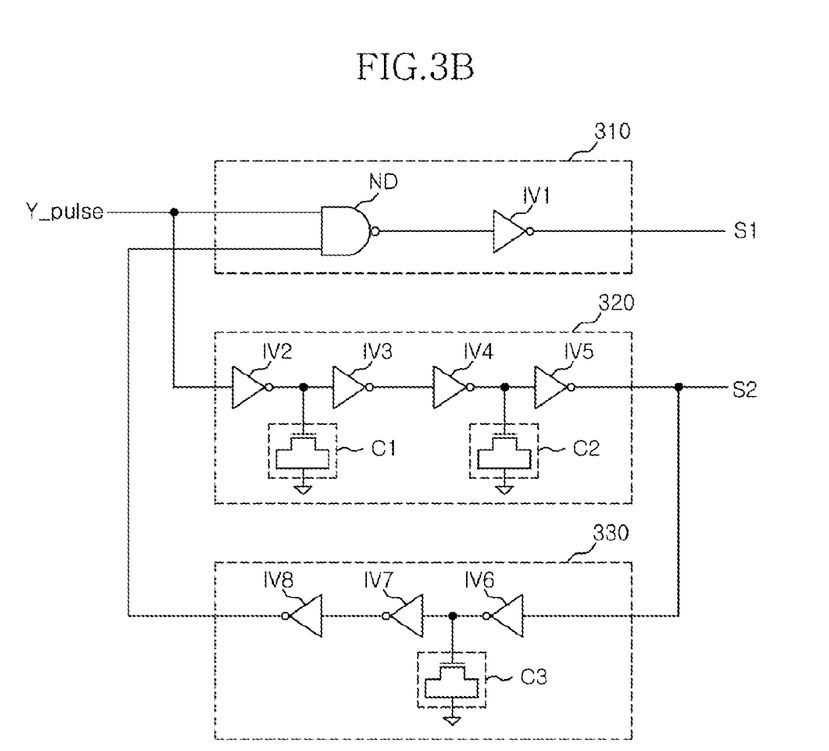

FIGS. 3a and 3b are block and circuit diagrams, respectively, illustrating the sense amplifier control unit of FIG. 2. Referring to FIGS. 3a and 3b, the sense amplifier control unit 300 includes a first delay unit 310, a second delay unit 320 and a third delay unit 330.

The first delay unit 310 can provide the first enable signal (S1) in response to the column control pulse signal (Y_pulse) and the second enable signal (S2) which can be fed back to the first delay unit 310. The first delay unit 310 can include a NAND gate ND and a first inverter IV1. The NAND gate ND can combine the column control pulse signal (Y_pulse) and the second enable signal (S2) to be fed back to the first delay unit 310. The first enable signal (S1) can be activated with the lapse of a predetermined time from the activation of the column control pulse signal (Y_pulse), and it is inactivated in response to the activation level of the second enable signal S2.

The second delay unit 320 can provide the second enable signal (S2) in response to the column control pulse signal (Y_pulse). The second delay unit 320 can include second to fifth inverters IV2 to IV5 and first and second MOS capacitors C1 and C2. The second enable signal (S2) can have the same pulse width as the column control pulse signal (Y_pulse), and it can be delayed for a predetermined time and then activated after the sensing operation of the first sense amplifier block (reference numeral 100 of FIG. 2) is stabilized. The number of the second to fifth inverters IV2 to IV5 and the first and second MOS capacitors C1 and C2 can be adjusted to satisfy such a predetermined time. Also, the delay amount of the first and second MOS capacitors C1 and C2 can be adjusted by using a RC delay.

The third delay unit 330 can invert and delay the second enable signal (S2) and provide it to the first delay unit 310. The third delay unit 330 can include sixth to eighth inverters IV6 to IV8 and a third MOS capacitor C3. The number of the delay elements can be adjusted to control the first enable signal (S1) after the stabilized sensing level of the second sense amplifier block (reference numeral 200 of FIG. 2) is secured. Although only one third MOS capacitor C3 is exemplified, the number of the third MOS capacitor C3 can be plural according to a delay time.

The operation of a sense amplifier control unit 300 will be described below.

When the column control pulse signal (Y_pulse), which has an activated high level section, and an inverted and delayed signal of the inactivated second enable signal S2, which is in a high level, are inputted to the NAND gate ND, the first enable signal (S1) can be activated according to a NAND operation. Also, the second enable signal (S2) can be activated after a predetermined time taken by the delay elements of the second delay unit 320 in response to the activated column control pulse signal (Y_pulse). At this time, the second enable signal (S2) of a high level can be inverted and delayed through the third delay unit 330. The inverted and delayed signal of a low level can be inputted to the NAND gate ND, and thus, the level of the first enable signal (S1) can become low and the first enable signal is inactivated.

On the other hand, in the conventional data bus sense amplifier circuit, the first enable signal (S1) and the second enable signal (S2) are generated as delayed signals which maintain the same pulse width as the column control pulse signal (Y_pulse). The first sense amplifier block 10 operates in response to the first enable signal (S1) and the second sense amplifier block 20 operates in response to the second enable signal (S2) after a predetermined time. Thus, although the operation of the first sense amplifier block 10 is unnecessary after the sensing operation of the second sense amplifier block 20 starts, the first sense amplifier block 10 still operates in response to the first enable signal (S1) which is maintained with a predetermined pulse width and then inactivated.

However, according to one embodiment, the first enable signal (S1) can be inactivated in synchronization with the activation timing of the second enable signal S2. Therefore, when the sensing operation of the second sense amplifier block 200 starts, the first enable signal (S1) is inactivated and thus the operation of the first sense amplifier block 100 can be controlled to be inactivated.

In one example, a case where the first and second enable signals (S1) and (S2) are used for the first and second sense amplifier blocks 100 and 200 will be described by referring to FIGS. 4a and 4b.

Figure 4A:
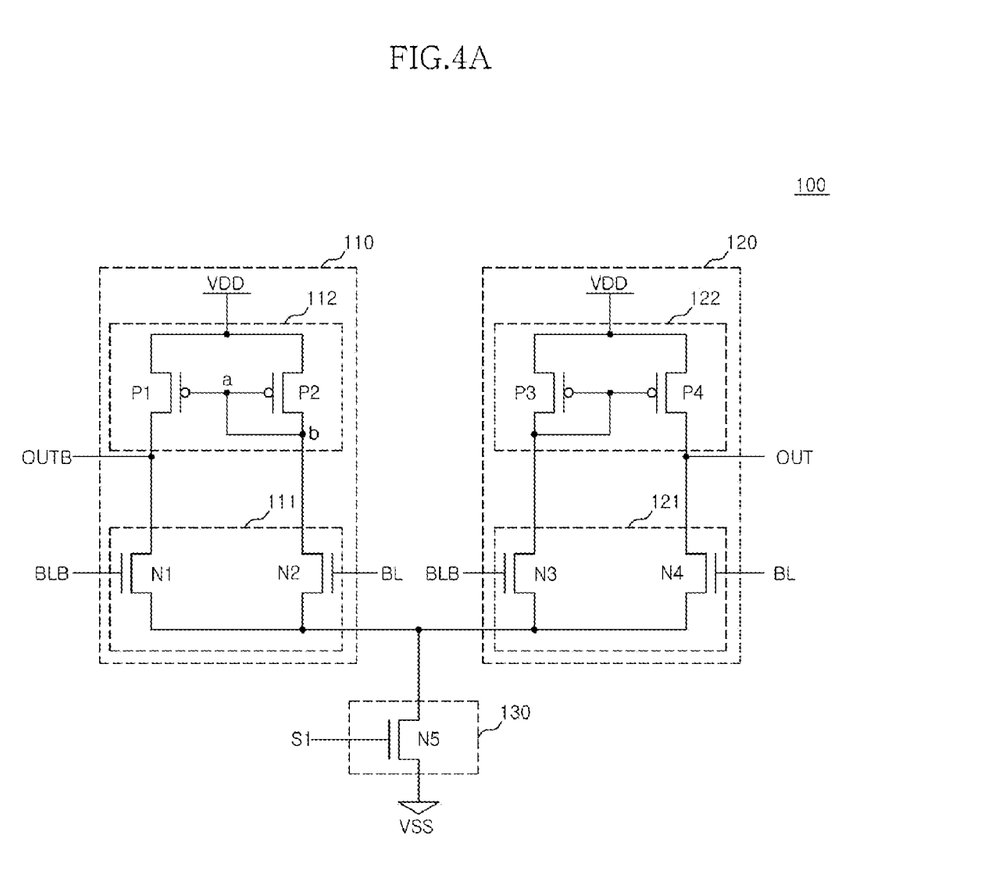
FIG. 4a is a circuit diagram of a first sense amplifier block that can be included in the circuit illustrated in FIG. 2.

FIG. 4a is a circuit diagram of the first sense amplifier block 100. In one embodiment, the first sense amplifier block 100 can include a sense amplifier of which type is a differential amplifier. Referring to FIG. 4a, the first sense amplifier block 100 can include a first differential amplifier 110, a second differential amplifier 120 and a control unit 130. The first differential amplifier 110 can include a signal receiving unit 111 and a current mirror 112.

The signal receiving unit 111 can receive the bit line signals (BL) and (BLB). The signal receiving unit 111 can include first and second NMOS transistors N1 and N2. The first NMOS transistor N1 can include a gate which receives the bit line signal (BLB), a drain which is connected to the first amplified signal (OUTB) and a source which is connected to the control unit 130. The second NMOS transistor N2 is in the opposite direction to the first NMOS transistor N1. The second NMOS transistor N2 can include a gate which receives the bit line signal BL, a drain which is connected to a node b and a source which is connected to the control unit 130.

The current mirror 112 can include first and second PMOS transistors P1 and P2. The first and second PMOS transistors P1 and P2 can include gates which are commonly connected to node b and sources which are commonly connected to an external power supply voltage VDD. Also, a drain of the first PMOS transistor P1 can be connected to the first amplified signal (OUTB) and a drain of the second PMOS transistor P2 can be connected to node b.

Meanwhile, the second differential amplifier 120 can include a signal receiving unit 121 and a current mirror 122. The signal receiving unit 121 can include third and fourth NMOS transistors N3 and N4. The current mirror 122 can include third and fourth PMOS transistors P3 and P4. The third and fourth NMOS transistors N3 and N4 of the second differential amplifier 120 can correspond to the first and second NMOS transistors N1 and N2 of the first differential amplifier 110. Also, the third and fourth PMOS transistors P3 and P4 can correspond to the first and second PMOS transistors P1 and P2 of the first differential amplifier 110. Since the configuration of the second differential amplifier 120 overlap with the aforementioned description, they will be omitted.

The control unit 130 can include a fifth NMOS transistor N5. The control unit 130 can control the activation of the first sense amplifier block 100 according to the level of the received first enable signal S1.

The operation of the first sense amplifier block 100 will be described below. When the control unit 130 is activated, the first differential amplifier 110 and the second differential amplifier 120 can start a sensing operation. That is, the fifth NMOS transistor N5, which receives the first enable signal S1, can be turned on.

Thus, the current mirrors 112 and 122 can provide the first amplified signals (OUT) and (OUTB) through sensing the minute difference of an electric current between the first and second NMOS transistors N1 and N2 and the third and fourth NMOS transistors N3 and N4 can be based on the levels of the bit line signals (BL) and (BLB), respectively. That is, while the first enable signal (S1) is activated, the first sense amplifier block 100 can perform a sensing operation. Particularly, since the first sense amplifier block 100 can include the sense amplifier of which type is a differential amplifier, a current consumption can be big because of the continuously sensing operation of the minute current difference. However, according to one embodiment, the first sense amplifier block 100 can be inactivated when the sensing operation of the second sense amplifier block 200 starts. Therefore, the current consumption can be reduced.

Figure 4B:
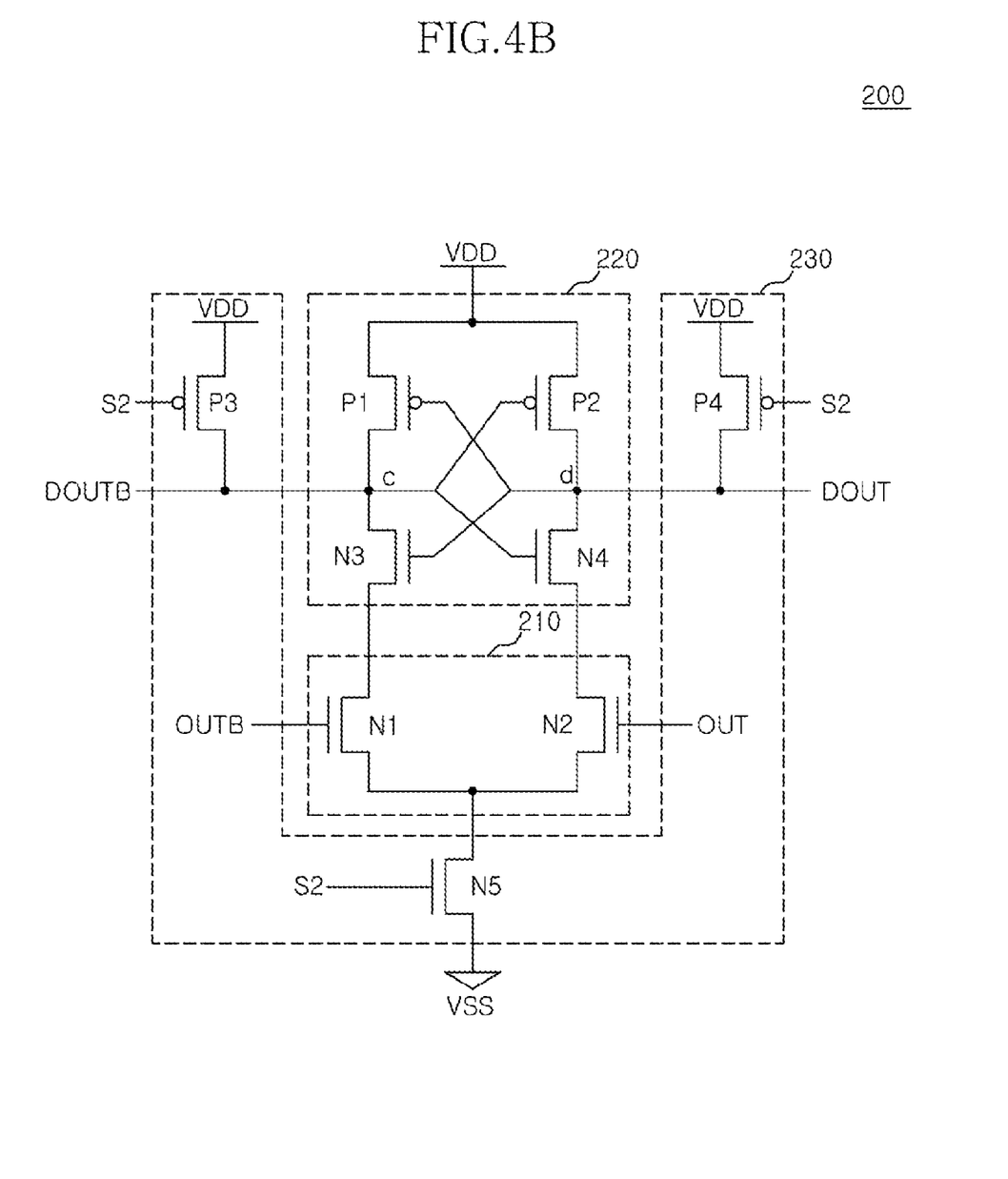
FIG. 4b is a circuit diagram of a second sense amplifier block that can be included in the circuit illustrated in FIG. 2.

FIG. 4b is a circuit diagram of a second sense amplifier block that can be included in the circuit illustrated in FIG. 2. According to one embodiment, the second sense amplifier block 200 can include a cross-coupled sense amplifier. Referring to FIG. 4b, the second sense amplifier block 200 can include a signal receiving unit 210, an amplifier 220, and a control unit 230.

The signal receiving unit 210 can receive the first amplified signals (OUT) and (OUTB). The signal receiving unit 210 can include first and second NMOS transistors N1 and N2. The first and second NMOS transistors N1 and N2 can include gates which receive the first amplified signals (OUTB) and (OUT), respectively, and sources which are commonly connected to a drain of a fifth NMOS transistor N5 of the control unit 230. Also, a drain of the first NMOS transistor N1 can be connected to a source of a third NMOS transistor N3 and a drain of the second NMOS transistor N2 can be connected to a source of a fourth NMOS transistor N4.

The amplifier 220 can latch the difference of the electric current driven by the signal receiving unit 210 to provide the second amplified signals (DOUT) and (DOUTB). The amplifier 220 can include first and second PMOS transistors P1 and P2 and third and fourth NMOS transistors N3 and N4.

The first PMOS transistor P1 and the third NMOS transistor N3 are of an inverter type. Gates of the first PMOS transistor P1 and the third NMOS transistor N3 can be connected to node d, a source of the first PMOS transistor P1 can be connected to an external power supply voltage VDD, and the source of the third NMOS transistor N3 can be connected to the drain of the first NMOS transistor N1. The second PMOS transistor P2 and the fourth NMOS transistor N4, which can be in the opposite direction to the first PMOS transistor P1 and the third NMOS transistor N3, can also be of an inverter type. Gates of the second PMOS transistor P2 and the fourth NMOS transistor N4 can be connected to node c. Thus, the amplifier 220 can have a cross-coupled latch structure.

The control unit 230 can receive the second enable signal (S2) and control the activation of the second sense amplifier block 200. The control unit 230 can include third and fourth PMOS transistors P3 and P4 and the fifth NMOS transistor N5. When the control unit 230 receives the second enable signal (S2) of a high level, the fifth NMOS transistor N5 can be turned on and the third and fourth transistors P3 and P4 can be turned off.

The operation of the second sense amplifier block 200 can be configured as follows. The second sense amplifier block 200 can receive the activated second enable signal S2. The second sense amplifier block 200 can compare the first amplified signals (OUT) and (OUTB) and sense the voltage difference. For example, when the first amplified signal (OUT) is in a high level, the second NMOS transistor N2 can be turned on and the level of node d becomes minutely low. Thus, the level of the second amplified signal (DOUTB) can become high through the first PMOS transistor P1 which is connected to node d. Also, the fourth NMOS transistor N4, which receives a high level signal from node c, can be turned on so that the second amplified signal (DOUT) of a low level can be further provided. Thus, when the second sense amplifier block 200 senses the first amplified signals (OUT) and (OUTB), the latch operation can be performed until the first amplified signals (OUT) and (OUTB) having changed information are received.

Figure 5:
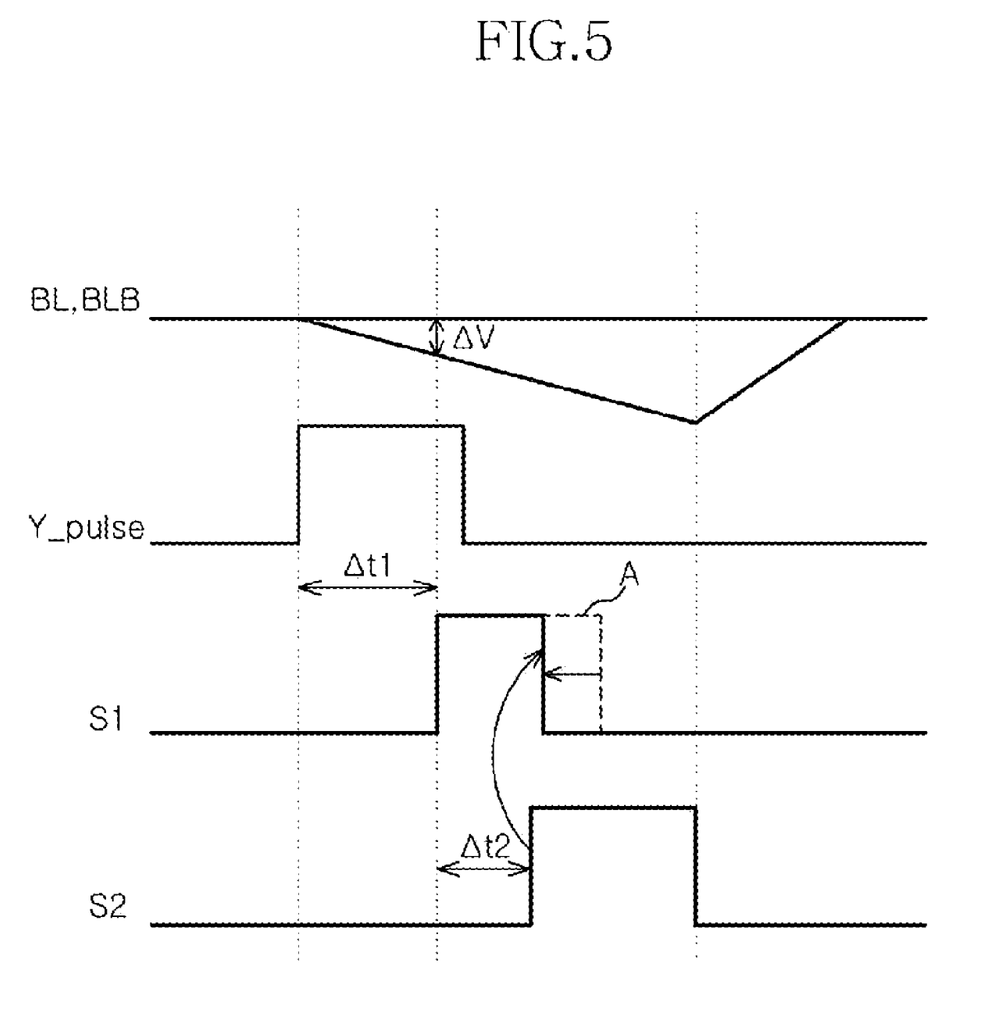
FIG. 5 is a timing diagram of the data bus sense amplifier circuit that can be included in the circuit illustrated in FIG. 2.

FIG. 5 is a timing diagram of the data bus sense amplifier circuit that can be included in the circuit illustrated in FIG. 2. The operation of the data bus sense amplifier circuit will be described below referring to FIGS. 1 to 5.

The column control pulse signal (Y_pulse), which shows the start of the sensing operation of the data bus sense amplifier circuit, can have a predetermined section in which it can be activated at a high level. Thus, the bit line signals (BL) and (BLB), which have been equalized, can gradually swing in their own levels. At this time, the first enable signal (S1) can be activated with the lapse of a delay time of $\Delta t1$ which can last until a predetermined potential difference of $\Delta V$ is generated. Also, the second enable signal (S2) can be delayed more than the first enable signal (S1) to be activated. That is, the first amplified signals (OUT) and (OUTB), which can be sensed from the first sense amplifier block 100, can make the second sense amplifier block 200 operate after a delay time of $\Delta t2$ in which a predetermined potential difference is secured. In this case, the inactivation timing of the first enable signal (S1) can be synchronized with the activation timing of the second enable signal S2. In other words, the pulse width of the first enable signal (S1) can be more reduced than that of a conventional data bus sense amplifier circuit so that the section in which the first enable signal (S1) is activated can be reduced and the current consumption can be decreased. In this way, when the second sense amplifier block 200 starts sensing, the first sense amplifier block 100 can inactivate.

Here, the first sense amplifier block 100 can be inactivated with the lapse of a predetermined delay time from the sensing operation of the second sense amplifier block 200 in order to guarantee a stable operation. Then, when the second amplified signals (DOUT) and (DOUTB) are stably provided to the global data line having a long wiring, the second enable signal (S2) can be inactivated.

Since the second amplifier block 200 can provide the second amplified signals (DOUT) and (DOUTB) to the global data line having a long wiring, the operation of the second amplifier block 200 may need considerable time to reach a stable level. Therefore, since the pulse width of the second enable signal (S2) can be maintained as long as the pulse width of the column control pulse signal (Y_pulse), there is a case that the pulse width of the column control pulse signal (Y_pulse) may be wide.

Although the first enable signal (S1) can be activated in response to the activation level of the column control pulse signal (Y_pulse) according to one embodiment described herein, it can also be inactivated in response to the activation level of the second enable signal S2. Thus, the first enable signal (S1) may not be affected by the pulse width of the column control pulse signal (Y_pulse). Therefore, even though the pulse width of the column control pulse signal (Y_pulse) is wide, the current consumption due to the operation of the first sense amplifier block 100 may not be increased.

Accordingly, in the two-stage data bus sense amplifier circuit it is possible to control the inactivation timing of the first sense amplifier block by synchronizing the one-stage first sense amplifier block with the activation timing of the second sense amplifier block. Therefore, when the second sense amplifier block starts sensing, the first sense amplifier block can be inactivated and the current consumption is then reduced.

While certain embodiments have been described above, it will be understood that the embodiments described are by way of example only. Accordingly, the apparatus and methods described herein should not be limited based on the described embodiments. Rather, the apparatus and methods described herein should only be limited in light of the claims that follow when taken in conjunction with the above description and accompanying drawings.

What is claimed is:

1. A data bus sense amplifier circuit comprising:
   a first sense amplifier block configured to provide first amplified signals by sensing input signals;
   a second sense amplifier block coupled to the first sense amplifier block, wherein the second sense amplifier block is configured to provide second amplified signals by sensing the first amplified signals; and
   a sense amplifier control unit coupled to both the first and second sense amplifier blocks, wherein the sense amplifier control unit is configured to provide first and second enable signals, which control activations of the first and second sense amplifier blocks, respectively, wherein the sense amplifier control unit controls the first enable signal to be synchronized with the second enable signal so that the first enable signal is inactivated.

2. The data bus sense amplifier circuit of claim 1, wherein the sense amplifier control unit comprises:
   a first delay unit configured to provide the first enable signal in response to a column control pulse signal and an inverted and delayed feedback signal of the second enable signal;
   a second delay unit configured to provide the second enable signal in response to the column control pulse signal; and
   a third delay unit coupled between the second delay unit and the first delay unit, the third delay unit configured to invert and delay the second enable signal to provide the second enable signal as the feedback signal to the first delay unit.

3. The data bus sense amplifier circuit of claim 2, wherein the first delay unit configured to provide the first enable signal, which is inactivated in response to the activation level of the second enable signal, by receiving the inverted and delayed feedback signal of the second enable signal, which is activated in response to the activation level of the column control pulse signal.

4. The data bus sense amplifier circuit of claim 3, wherein the first delay unit includes a NAND gate, which is configured to combine the column control pulse signal and the second enable signal fed back from the third delay unit.

5. The data bus sense amplifier circuit of claim 2, wherein the second delay unit is configured to provide the second enable signal, which is delayed for a predetermined time to be activated, and wherein the second enable signal is produced after an activation timing of the first enable signal.

6. The data bus sense amplifier circuit of claim 2, wherein the first to third delay units further comprise a MOS capacitor, which is configured to minutely control a delay time.

7. The data bus sense amplifier circuit of claim 1, wherein the first sense amplifier block comprises a sense amplifier, which is a differential amplifier.

8. The data bus sense amplifier circuit of claim 1, wherein the second sense amplifier block comprises a cross-coupled sense amplifier.

9. The data bus sense amplifier circuit of claim 1, wherein the input signals are transferred from bit lines of a memory cell.

10. The data bus sense amplifier circuit of claim 1, wherein the second amplified signals are provided to global data lines.

11. A data bus sense amplifier circuit comprising:
    a sense amplifier control unit configured to provide a first enable signal and a second enable signal generated in response to a column control pulse signal, wherein the first enable signal of the sense amplifier control unit is inactivated in response to a feedback level of the second enable signal.

12. The data bus sense amplifier circuit of claim 11, wherein the sense amplifier control unit comprises:
    a first delay unit configured to provide the first enable signal in response to the column control pulse signal and an inverted and delayed feedback signal of the second enable signal;
    a second delay unit configured to provide the second enable signal in response to the column control pulse signal; and
    a third delay unit coupled between the second delay unit and the first delay unit, the third delay unit configured to invert and delay the second enable signal to provide the second enable signal as the feedback signal to the first delay unit.

13. The data bus sense amplifier circuit of claim 12, wherein the first delay unit is configured to provides the first enable signal, which is inactivate in response to the activation level of the second enable signal, by receiving the inverted and delayed feedback signal of the second enable signal, which is activate in response to the activation level of the column control pulse signal.

14. The data bus sense amplifier circuit of claim 13, wherein the first delay unit comprises a NAND gate, which is configured to combine the column control pulse signal and the second enable signal fed back from the third delay unit.

15. The data bus sense amplifier circuit of claim 12, wherein the second delay unit is configured to provide the second enable signal, which is delayed for a predetermined time to be activated, and wherein the second enable signal is produced after an activation timing of the first enable signal.

16. The data bus sense amplifier circuit of claim 12, wherein the first to third delay units further comprise a MOS capacitor, which is configured to minutely control a delay time.

17. The data bus sense amplifier circuit of claim 11, wherein a pulse width of the first enable signal is more narrow than that of the column control pulse signal, and wherein a pulse width of the second enable signal is maintained as much as that of the column control pulse signal.

18. A data bus sense amplifier circuit comprising:
  a first sense amplifier block configured to provide first amplified signals in response to a first enable signal by sensing signals which are inputted from bit lines;
  a second sense amplifier block coupled to the first sense amplifier block, the second sense amplifier block configured to provide second amplified signals in response to a second enable signal by sensing the first amplified signals from the first sense amplifier block; and
  a sense amplifier control unit coupled to both the first and second sense amplifier blocks, the sense amplifier control unit configured to provide the first enable signal and the second enable signal, wherein the first and second enable signals are configured to control activations of the first and second sense amplifier blocks, respectively, and wherein the sense amplifier control unit includes:
    a first delay unit configured to provide the first enable signal in response to a column control pulse signal and an inverted and delayed feedback signal of the second enable signal;
    a second delay unit configured to provide the second enable signal in response to the column control pulse signal; and
    a third delay unit coupled between the second delay unit and the first delay unit, the third delay unit configured to invert and delay the second enable signal to provide the second enable signal as the feedback signal to the first delay unit.

19. The data bus sense amplifier circuit of claim 18, wherein the first delay unit is configured to provide the first enable signal, which is configured to inactivate in response to the activation level of the second enable signal, by receiving the inverted and delayed feedback signal of the second enable signal, which is configured to activate in response to the activation level of the column control pulse signal.

20. The data bus sense amplifier circuit of claim 19, wherein the first delay unit comprises a NAND gate, which is configured to combine the column control pulse signal and the second enable signal fed back from the third delay unit.

21. The data bus sense amplifier circuit of claim 18, wherein the second delay unit is configured to provide the second enable signal, which is delayed for a predetermined time to be activated, wherein the second enable signal is produced after an activation timing of the first enable signal.

22. The data bus sense amplifier circuit of claim 18, wherein the first to third delay units further comprise a MOS capacitor, which is configured to minutely control a delay time.

23. The data bus sense amplifier circuit of claim 18, wherein the first sense amplifier block comprises a sense amplifier, which is a differential amplifier.

24. The data bus sense amplifier circuit of claim 18, wherein the second sense amplifier block comprises a cross-coupled sense amplifier.

* * * * *